United States Patent
Suzuki et al.

(10) Patent No.: US 6,655,024 B2
(45) Date of Patent: Dec. 2, 2003

(54) METHOD OF MANUFACTURING A CIRCUIT BOARD

(75) Inventors: Masayuki Suzuki, Omihachiman (JP); Makoto Tose, Moriyama (JP); Koji Yoshida, Kusatsu (JP); Tadayuki Okawa, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 14 days.

(21) Appl. No.: 10/127,477

(22) Filed: Apr. 23, 2002

(65) Prior Publication Data

US 2002/0179333 A1 Dec. 5, 2002

(30) Foreign Application Priority Data

May 28, 2001 (JP) ........................................ 2001-159154

(51) Int. Cl.⁷ ................................................ H01K 3/10
(52) U.S. Cl. ........................................................ 29/852
(58) Field of Search .......................... 29/852, 840, 832, 29/825, 830, 846

(56) References Cited

U.S. PATENT DOCUMENTS 5,108,553 A * 4/1992 Foster et al.
5,966,593 A * 10/1999 Budnaitis et al.
6,240,636 B1 * 6/2001 Asai et al.

FOREIGN PATENT DOCUMENTS

| JP | 5-190545 | 7/1993 |
| JP | 8-314113 | 11/1996 |
| JP | 10-284835 | * 10/1998 |
| JP | 11-243278 | * 9/1999 |
| JP | 11-243280 | * 9/1999 |

* cited by examiner

Primary Examiner—Carl J. Arbes
(74) Attorney, Agent, or Firm—Keating & Bennett, LLP

(57) ABSTRACT

A method for manufacturing a circuit board having a through-hole for defining via hole, which has a sloped inner wall tilted at a desired tilt angle θ, is provided. The through-hole has an inverted-trapezoidal cross-section and is made using a photomask having a via hole pattern including a light-shielding pattern corresponding to the bottom of the through-hole, and pluralities of light-shielding strips and translucent strips which are arranged alternately and substantially parallel to one another, the pluralities of light-shielding strips and translucent strips corresponding to the sloped inner wall of the through-hole. The tilt angle θ is determined using a polynomial approximation of degree n:

$$f(s) = \theta = \phi \sum_{k=0}^{n} C_k s^k$$

wherein s is the width of the light-shielding strips and φ is a constant relating to the exposure conditions, and is in the range of about 0.17 rad<θ<about 1.40 rad.

17 Claims, 4 Drawing Sheets

METHOD OF MANUFACTURING A CIRCUIT BOARD

BACKGROUND OF THE INVENTION

1. Field of the Invention

The present invention relates to a circuit board having a via hole formed by filling a through-hole in an interlayer insulation film with an electrode, the through-hole having an inverted-trapezoidal cross-section, which is suitable for use in the microwave or millimeter-wavebands. The present invention also relates to a manufacturing method for such a circuit board.

2. Description of the Related Art

In recent wireless communication systems, miniaturization, cost reduction, and higher performance of RF devices for use in the microwave or millimeter-wave bands are increasingly demanded. For example, efficient transmission lines having low transmission losses and electrode materials having low resistances are desired.

Interlayer insulation films between connections are usually desired to be made of a dielectric material having a low relative dielectric constant and a low dielectric dissipation factor.

To meet these needs, a multilayer circuit board using a low-resistance material such as Au, Cu, Ag, or Al as the electrode material and an organic resin having a low relative dielectric constant and a low dielectric dissipation factor such as polyimides, epoxies, benzocyclobutene, bismaleimide triazines, or other suitable material as a dielectric material has been developed.

Referring to FIG. 5, one conventional method of making a via hole in an interlayer insulating film of the multilayer circuit board uses photolithography. The method makes the through-hole for forming a via hole by using a photomask 50 including a light-shielding pattern 51 for forming a through-hole (a through-hole for forming a via hole). As shown in FIG. 5, the way of using photolithography is that firstly, the photomask 50 is placed on a photosensitive resin film (not shown), secondly, the photosensitive resin film is exposed by using ultraviolet light, thirdly, the resin film is developed by a solvent, lastly, the unexposed portions of the resin film are dissolved and removed.

However, as shown in FIG. 6, when the interlayer insulation film 63 covering a lower conductor connection 62 on the surface of a substrate 61 has a large thickness, and if a through-hole for forming a via hole is made by using above process, a tilt of inner walls 64a of the through-hole 64 which is formed in the interlayer insulation film 63 is insufficient. Therefore, the tilt of the through-hole 64 is approximately perpendicular. When an upper conductor connection 65 is formed on the interlayer insulation film 63, as shown in FIG. 7, the upper conductor connection 65 is not connected to the lower conductor connection 62, which is formed on the substrate 61, because edges 64b of the through-hole 64 disconnect the upper conductor connection 65.

In other words, when forming the upper conductor connection 65, the through-hole for making a via hole must have an inverted-trapezoidal cross-section and inner walls which are suitably tilted in order to form a defect-free uniform metallic film on the inner walls 64a of the through-hole 64.

Examples of known methods for forming a through-hole for defining a via hole, the through-hole having an inverted-trapezoidal cross-section and inner walls which are suitably tilted, include:

(1) a method for forming a micro pattern that is smaller than the resolution limit of the photosensitive resin film, which is the precursor film of the interlayer insulation film;

(2) a method for forming a pattern that is smaller than the resolution limit of the photosensitive resin film at a through-hole formation-pattern region on an exposure mask and adjusting the layout of the pattern; and (3) a method for adjusting the number, the arrangement, the shape, and other characteristics of the openings in the pattern.

In method (1), for example, the film is a positive photosensitive resin film, which has the exposed portions being dissolved and removed during development. The film is exposed at a low exposure level so that the film is developed to a depth corresponding to the exposure level. According to method (1), the inner walls of the through-hole for making the via hole can be sufficiently tilted, but control of the tilt angle is practically impossible.

Methods (2) and (3) can control the shape of the through-hole for making the via hole and the tilt angle of the inner walls. However, in order to control the tilt angle of the inner walls to a desired angle, test runs must be performed using various types of photomasks. This causes problems including increased costs for making the various types of photomasks and increased time to evaluate the test results.

SUMMARY OF THE INVENTION

In order to overcome the problems described above, preferred embodiments of the present invention provide a method for manufacturing a circuit board including a through-hole having an inverted-trapezoidal cross-section and sloped inner wall stilted at a desired tilt angle without requiring complex processes or any increase in cost.

In addition, preferred embodiments of the present invention provide a circuit board in which an upper connection conductor is reliably connected to a lower connection conductor by using the manufacturing method of the present invention.

According to one preferred embodiment of the present invention, a method for manufacturing a circuit board includes the steps of forming a lower conductor connection on a substrate, applying a photosensitive resin on the lower conductor connection and drying the photosensitive resin to form a photosensitive resin film, exposing the photosensitive resin film via a photomask for patterning, and developing and drying the photosensitive resin film so as to form an insulating resin film including a through-hole for forming a via hole, the through-hole having an inverted-trapezoidal cross-section taken in the direction of the substrate thickness and sloped inner walls tilted at a tilt angle θ with respect to the substrate, and forming an upper conductor connection on the insulating resin film so as to connect the upper conductor connection to the lower conductor connection through the through-hole in the insulating resin film. The photomask has a via hole pattern including a light-shielding pattern corresponding to the bottom of the through-hole, and pluralities of light-shielding strips and translucent strips which are arranged alternately and substantially parallel to one another, the pluralities of light-shielding strips and translucent strips corresponding to the sloped inner walls of the through-hole. The tilt angle θ, which is determined using a polynomial approximation of degree n:

$$f(s) = \theta = \phi \sum_{k=0}^{n} C_k s^k$$

wherein s is the width of the light-shielding strips and φ is a constant relating to the exposure conditions, is in the range of about 0.17 rad<θ<about 1.40 rad.

According to the above-described method, a through-hole having an inverted-trapezoidal cross-section and a sloped inner wall tilted at an tilt angle θ of about 0.17 rad<θ<about 1.40 rad can be efficiently formed in a circuit board.

Moreover, because the tilt angle θ is determined by the nth degree function described above, the tilt angle θ can be adjusted to any desired angle within the range of about 0.17 rad<θ<about 1.40 rad by simply changing the width of the light-shielding strips. Thus, a circuit board in which an upper conductor connection is connected to a lower conductor connection can be reliably manufactured.

The tilt angle θ is adjusted within the range of about 0.17 rad<θ<about 1.40 rad to secure electrical connection between the lower and upper conductor layers without inhibiting the miniaturization of devices. At an angle exceeding about 1.40 rad, the sloped inner wall is insufficiently tilted, and the connection between the lower and upper conductor layers breaks, as described in the related art shown in FIGS. 6 and 7. At an angle of less than about 0.17 rad, the connection is secured, but the diameter of the via hole is excessively large, thereby inhibiting miniaturization of devices.

Preferably, each of the upper conductor connection and the lower conductor connection includes at least one material selected from the group consisting of Cu, Au, Ag, Al, Ni, Ti, Cr, NiCr, Nb, V, Ta, W, Pt, and Mo so as to reliably manufacture circuit boards having all the required characteristics.

Preferably, the insulating resin film includes at least one resin selected from polyimides, epoxies, benzocyclobutene, bismaleimide triazines, acrylics, and cyclic olefins. With these materials, an insulating resin film having required insulation characteristics can be reliably formed.

Preferably, in the step of forming an upper conductor connection on the insulating resin film, the upper conductor connection is formed on the insulating resin film by one of vapor deposition, sputtering, and plating so as to reliably manufacture a circuit board having high connection reliability at the via hole.

Preferably, the translucent strips in the photomask are aligned substantially parallel to the top edge of the sloped inner wall, and the widths of the translucent strips are gradually increased from that of the strip corresponding to the bottom of the sloped inner wall to that of the strip corresponding to the top of the sloped inner wall so that the exposure level of the sloped inner wall is gradually increased from the bottom to the top of the sloped inner wall. With such a photomask, a through-hole having an inverted-trapezoidal cross-section and a sloped inner wall tilted at a desired tilt angle can be reliably formed.

Preferably, the width of each of the translucent strips is in the range of about ¼ to about 1/20 of the thickness of the insulating resin layer and the interval between the translucent strips is in the range of about ¼ to about 1/20 of the thickness of the insulating resin layer so as to make a through-hole having an inverted-trapezoidal cross-section and a sloped inner wall tilted at a desired tilt angle.

Preferably, the number of translucent strips in the photomask is 2 to 10. Using such a simple photomask, a circuit board having a through-hole having an inverted-trapezoidal cross-section and a sloped inner wall tilted at a tilt angle θ in the range of about 0.17 rad<θ<about 1.40 rad can be reliably formed.

Another preferred embodiment of the present invention provides a circuit board including a substrate, a lower conduct or connection, an insulating resin layer including a through-hole for defining a via hole, and an upper conductor connection. The lower conductor connection and the upper conductor connection are connected to each other through the through-hole. The through-hole has an inverted-trapezoidal cross-section, and a tilt angle θ of a sloped inner wall of the through-hole with respect to the substrate surface is in the range of about 0.17 rad<θ<about 1.40 rad.

A circuit board having the above-described unique structure has an upper conductor layer and a lower conductor layer securely connected to each other through a via hole because the tilt angle θ of the sloped inner wall of the through-hole is in the range of about 0.17 rad<θ<about 1.40 rad.

Other features, elements, characteristics and advantages of the present invention will become more apparent from the following description of preferred embodiments thereof with reference to the attached drawings.

DETAILED DESCRIPTION OF PREFERRED EMBODIMENTS

The present invention will now be described in detail by reference to preferred embodiments thereof.

FIGS. 1A to 1D and FIG. 2 are diagrams for explaining a method for making a circuit board according to a preferred embodiment of the present invention.

Figure 1A:
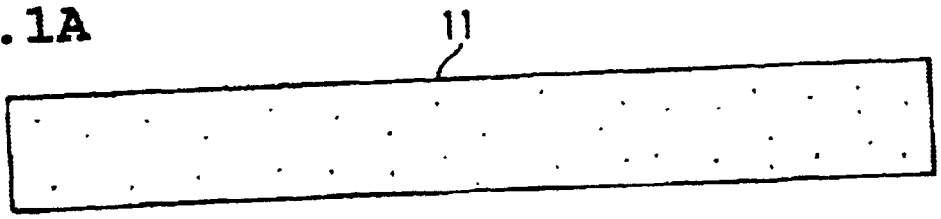
FIGS. 1A to 1E are diagrams illustrating main steps of a method for manufacturing a circuit board according to a preferred embodiment of the present invention.

Step 1: Referring to FIG. 1A, a substrate 11 is prepared. The substrate 11 may be preferably made of a ceramic such as alumina or a semiconductor such as Si or GaAs, or other suitable material. In this preferred embodiment, the substrate 11 is preferably made of Si.

The surface of the substrate 11 is cleaned by plasma ashing or with an organic solvent such as acetone, isopropyl alcohol, methanol, ethanol, or other suitable material.

Figure 1B:
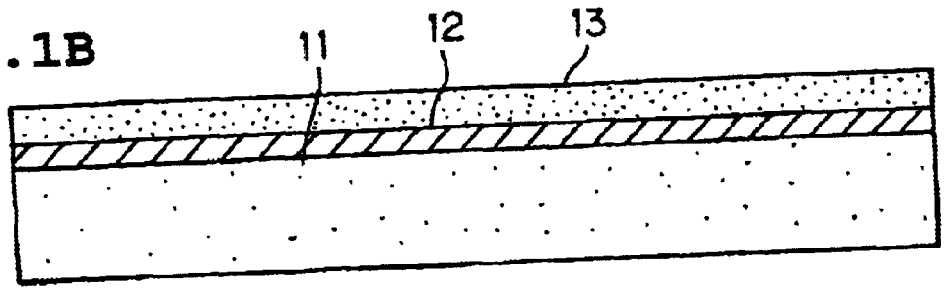

Step 2: Referring to FIG. 1B, a lower conductor connection 12 is formed on the substrate 11 and is coated with an adhesion promoter such as 3-aminopropyltriethoxysilane (3-APS) or other suitable material. Subsequently, a varnish-type cyclic olefin resin is applied onto the coated lower conductor connection 12 by means of spin coating at about 1,000 rpm for approximately 30 seconds, and is then baked at about 95° C. for about 120 seconds using a hotplate so as to prepare a photosensitive resin film 13. In this preferred embodiment, benzocyclobutene resin (BCB resin) containing 46% solid components is preferably used as the cyclic olefin system resin.

Figure 1C:
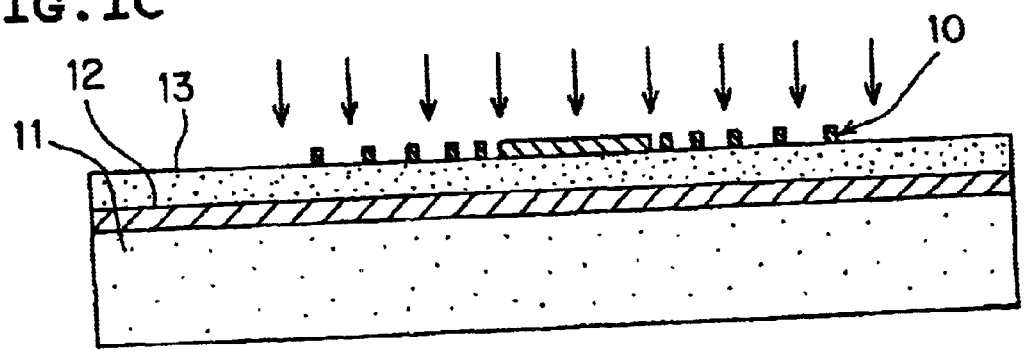
Figure 2:
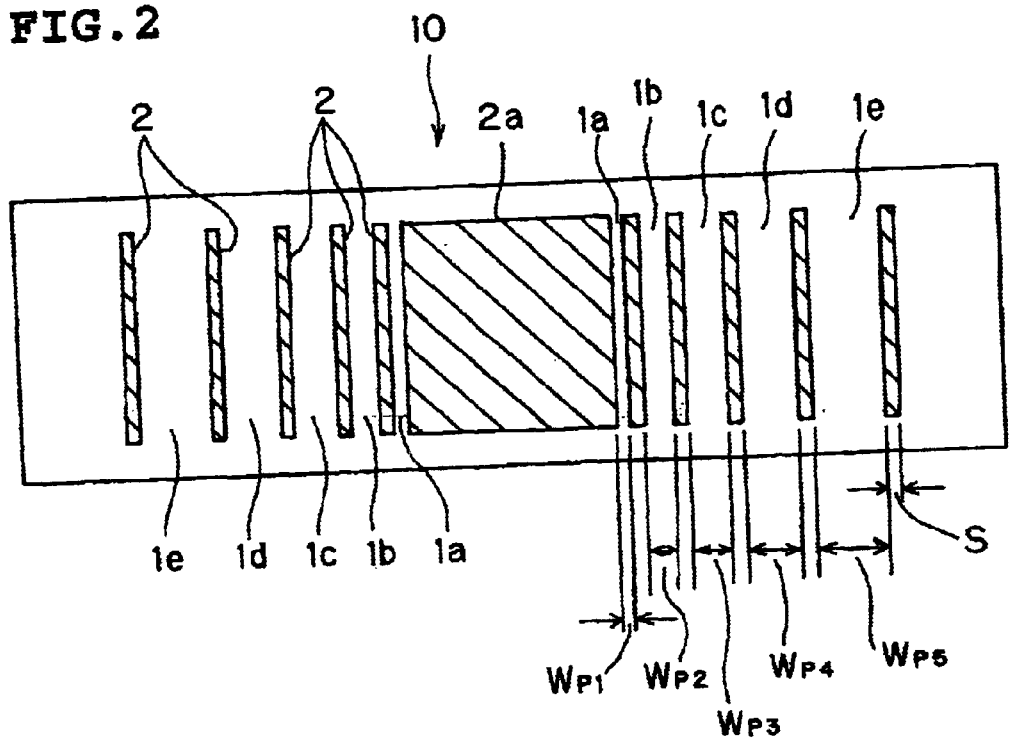
FIG. 2 is a plan view showing a photomask used in preferred embodiments of the method of the present invention.

Step 3: Referring to FIG. 1C, a photomask 10 shown in FIG. 2 is placed on the photosensitive resin film 13 and is subjected to contact irradiation using ultraviolet light having a wavelength of about 365 nm at an exposure level of about 840 mJ/cm².

The photomask 10 is made of glass and has a substantially square light-shielding pattern 2a at the center in the longitudinal direction. The light-shielding pattern 2a corresponds to the bottom of a through-hole for making a via hole. At each side of the light-shielding pattern 2a, a pattern including five translucent strips 1a, 1b, 1c, 1d and 1e aligned alternately with light-shielding strips 2 in a substantially parallel manner is provided. This pattern corresponds to the sloped inner wall of the through-hole for making the via hole.

The widths $W_{P1}$, $W_{P2}$, $W_{P3}$, $W_{P4}$, and $W_{P5}$ of the translucent strips 1a, 1b, 1c, 1d and 1e are approximately 1 μm, 2 μm, 3 μm, 4 μm, and 5 μm, respectively. The width of each of the light-shielding strips 2 is about 1 μm.

Step 4: Next, the photosensitive resin film 13 is developed in 1,3,5-triisopropylbenzene at a constant temperature of about 32° C. and is rinsed.

The photosensitive resin film 13 is then dried by spinning at about 3,000 rpm for approximately 60 seconds while blowing $N_2$. Subsequently, it is baked for approximately 90 seconds at about 95° C. using a hotplate so as to vaporize the remainder of the developing solution.

The photosensitive resin film 13 is then cured at a temperature of about 250° C. for one hour in a nitrogen atmosphere having an oxygen concentration of about 100 ppm or less so as to thermally polymerize the cyclic olefin system resin.

Figure 1D:
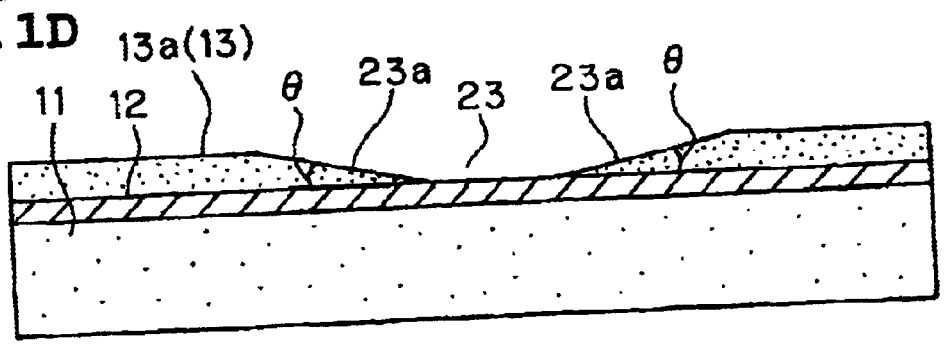

As shown in FIG. 1D, the cured photosensitive resin film 13 is formed into an insulating resin film 13a having a through-hole 23 for forming a via hole and a thickness of approximately 20 μm. As shown in FIG. 1D, the through-hole 23 has a cross-section having the shape of an inverted trapezoid, and inner walls 23a are tilted by a tilt angle θ of about 1.25 rad.

Figure 1E:
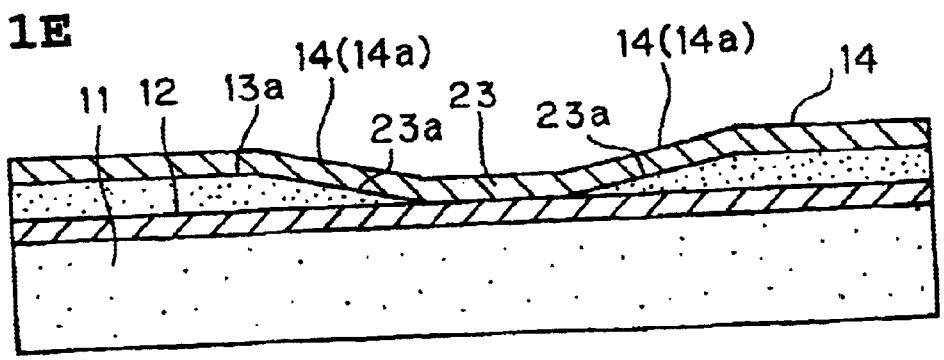

Step 5: Referring to FIG. 1E, an upper conductor connection 14 is formed on the insulating resin film 13a, which functions as an interlayer insulation film, by vapor deposition, sputtering, plating, or other suitable process.

In this preferred embodiment, during the above described process of patterning the photosensitive resin film 13 to form the through-hole 23 for the via hole and the sloped inner walls 23a, the tilt angle (the angle with respect to the substrate surface) θ of the sloped inner wall 23a is calculated using a polynomial approximation of degree n (Formula I):

$$f(s) = \theta = \phi \sum_{k=0}^{n} C_k s^k \quad \text{(Formula I)}$$

Figure 3:
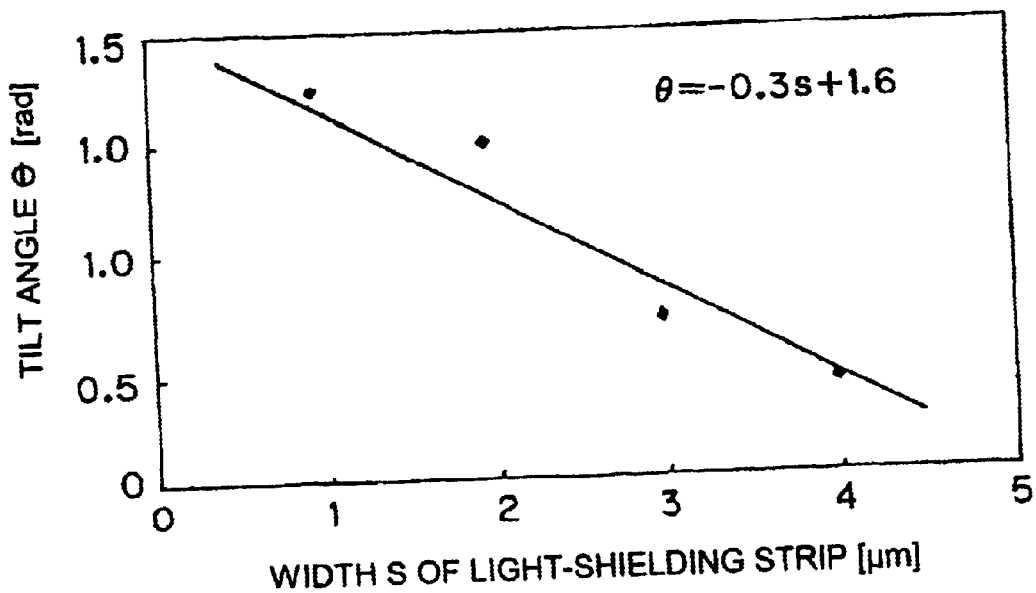
FIG. 3 is a graph showing the relationship between the width of light-shielding strips and the tilt angle θ of a sloped inner wall of a through-hole for making a via hole.

The relationship between the width s of each light-shielding strip 2 and the tilt angle θ of the sloped inner walls 23a of the through-hole 23 for making a via hole with respect to the horizontal axis is shown in FIG. 3.

The above polynomial approximation of degree n (Formula I) is applied to the measured points so as to obtain an approximate expression of the width s of the light-shielding strip 2 and the tilt angle θ:

$$f(s)=\theta=\phi(-0.3s+1.6)$$

wherein 0.5<ϕ<2 and ϕ is a constant relating to the exposure conditions. Since ϕ=1 in this preferred embodiment, $$f(s)=\theta=-0.3s+1.6$$

Using the inverse function of this linear function:

$$s=f(s)^{-1}=-\{(\theta-1.6)/(0.3)\}$$

the desired tilt angle θ can be obtained.

As described above, the through-hole 23 having a cross-section having the shape of an inverted trapezoid and the sloped inner walls 23a tilted at an angle θ of about 0.17 rad<θ<about 1.40 rad can be reliably formed by simply changing the width s of the light-shielding strips 2.

In this preferred embodiment, the tilt angle θ is about 1.25 rad. Conduction electrodes 14a can be uniformly formed on the sloped inner walls 23a of the through-hole 23 so as to be continuous with the upper conductor connection 14. Thus, a circuit board having the lower conductor connection 12 and the upper conductor connection 14 that are reliably connected to each other can be obtained.

Figure 6:
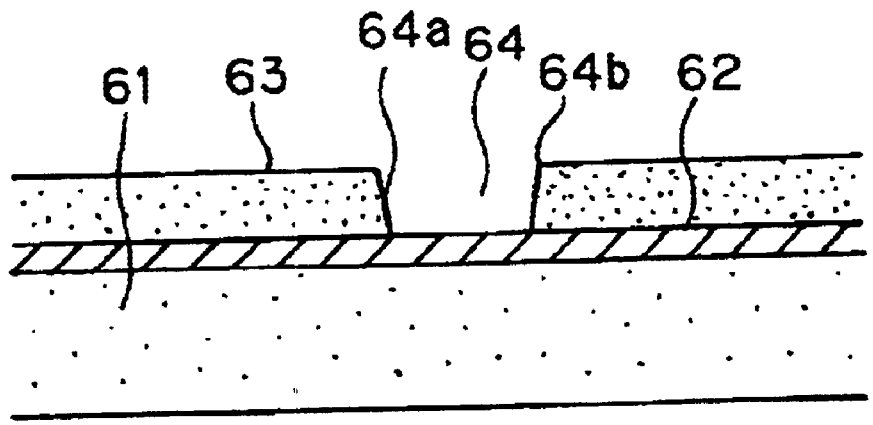
FIG. 6 is a cross-sectional view showing the shape of the through-hole for making a via hole made according to a conventional process.
Figure 7:
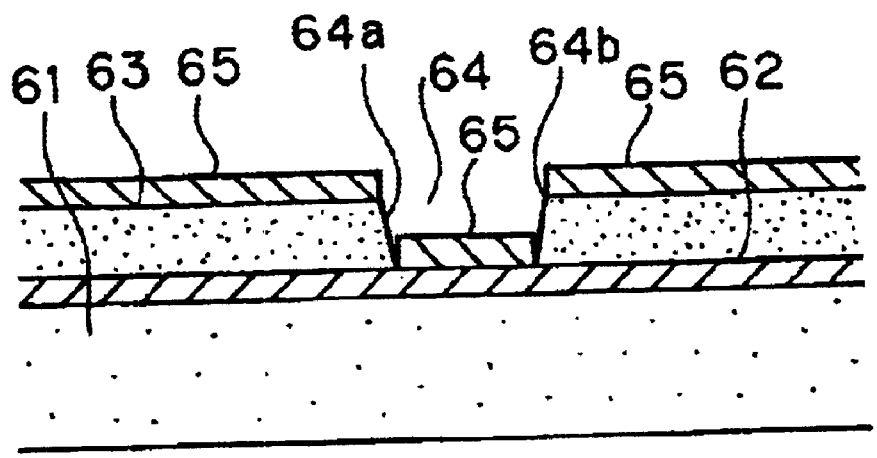
FIG. 7 is a cross-sectional view showing the state of connection between an upper conductor connection and a lower conductor connection when the through-hole is manufactured according to the conventional process.

In the conventional art shown in FIGS. 6 and 7, inner walls 64a are not sufficiently tilted and a through-hole 64 for defining a via hole is formed in a substantially perpendicular manner. When an upper conductor connection 65 is formed on an insulating resin film (interlayer insulating film) 63, the upper conductor connection 65 breaks at edges 64b of the through-hole 64 for defining a via hole and the upper conductor connection 65 cannot be connected to a lower conductor connection 62. Such a problem can be reliably avoided by the application of preferred embodiments of the present invention.

Although BCB resin is preferably used to form the insulating resin film (interlayer insulation film) 13a in the above-described preferred embodiment, the above-described nth degree function can be derived even when a resin other than BCB resin is used.

Although the photomask 10 of this preferred embodiment includes the translucent strips 1a, 1b, 1c, 1d and 1e having widths $W_{P1}$, $W_{P2}$, $W_{P3}$, $W_{P4}$, and $W_{P5}$ of approximately 1 μm, 2 μm, 3 μm, 4 μm, and 5 μm, respectively, at an interval of about 1 μm, i.e., separated by the light-shielding strips 2 each having a thickness of about 1 μm, the width of each translucent strip and the width s of each light-shielding strip 2 may be varied. For example, the width s of each light-shielding strip 2 may be about 3 μm or about 4 μm.

Moreover, the width of each translucent strip may be made uniform while varying the width of each light-shielding strip.

Figure 4:
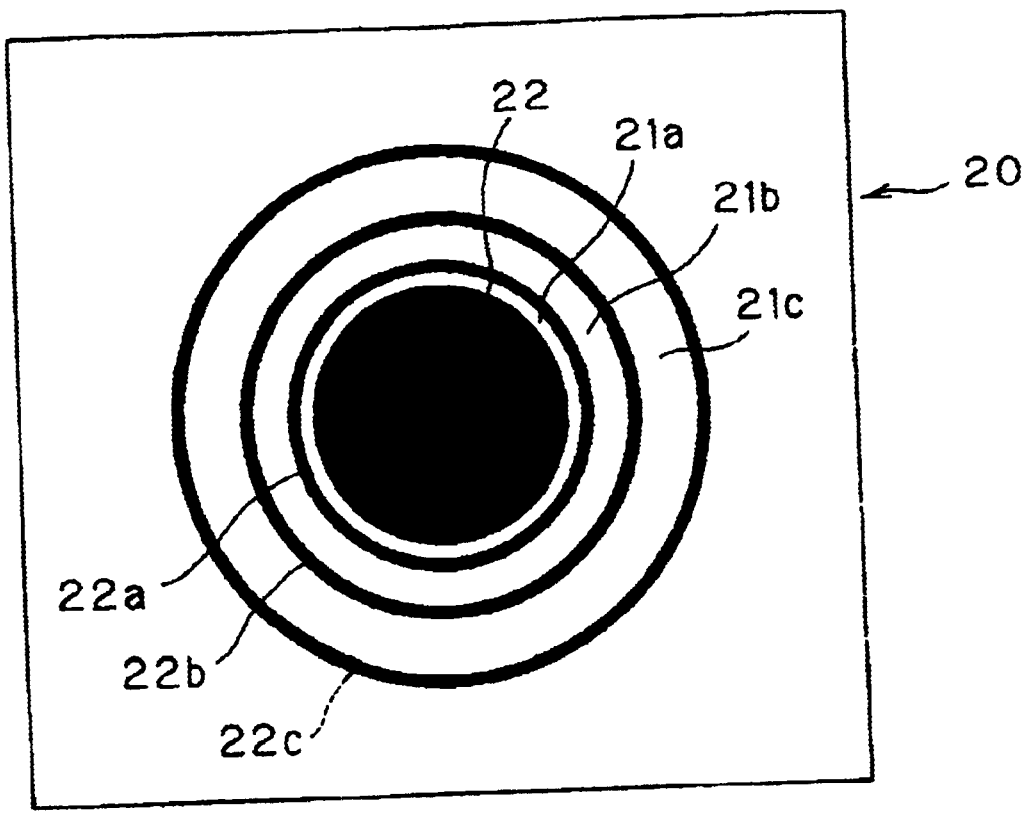
FIG. 4 is a plan view of another photomask used in preferred embodiments of the present invention.
Figure 5:
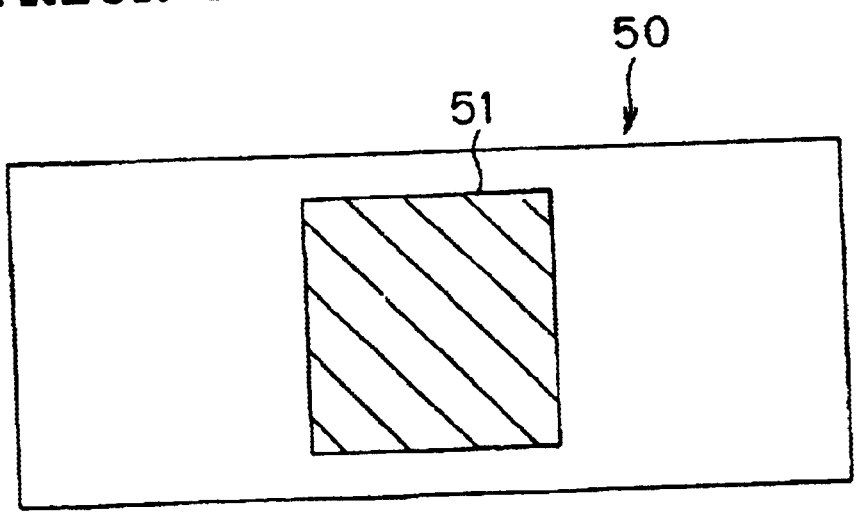
FIG. 5 is a plan view of a conventional photomask used in forming a through-hole for making a via hole.

Although the photomask 10 of this preferred embodiment preferably includes translucent strips 1a to 1e and light-shielding strips 2 having the shape of a straight line, the arrangement may be otherwise. For example, as shown in FIG. 4, a photomask 20 having a substantially circular light-shielding pattern 22 at the center, ring-shaped translucent strips 21a, 21b, and 21c, and ring-shaped light-shielding strips 22a, 22b, and 22c may be used to form a through-hole for making a via hole having a substantially circular planar shape and a cross-section having the shape of an inverted trapezoid.

The above-described preferred embodiments by no means limit the scope of the present invention. Various applications and modifications are possible without departing from the spirit of the present invention. Examples of modifiable features include the number of the translucent strips and the light-shielding strips, the shape and the material of the substrate, the pattern and the material of the upper and lower conductor connections, the method for forming the upper and lower conductor connections, the material and the application method of the photosensitive resin film, and the shape of the through-hole for defining a via hole.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a circuit board comprising the steps of:

forming a lower conductor connection on a substrate;

applying a photosensitive resin on the lower conductor connection and drying the photosensitive resin to form a photosensitive resin film;

exposing the photosensitive resin film via hole a photomask for patterning, and developing and drying the photosensitive resin film so as to form an insulating resin film including a through-hole for defining a via hole, the through-hole having an inverted-trapezoidal cross-section taken in the direction of the substrate thickness and a sloped inner wall tilted at a tilt angle θ with respect to the substrate; and forming an upper conductor connection on the insulating resin film so as to connect the upper conductor connection to the lower conductor connection through the through-hole in the insulating resin film, wherein the photomask has a via hole pattern including a light-shielding pattern corresponding to the bottom of the through-hole, and pluralities of light-shielding strips and translucent strips which are arranged alternately and substantially parallel to one another, the pluralities of light-shielding strips and translucent strips corresponding to the sloped inner wall of the through-hole, wherein the tilt angle θ, which is determined using a polynomial approximation of degree n:

$$f(s) = \theta = \phi \sum_{k=0}^{n} C_k s^k$$

wherein s is the width of the light-shielding strips and Φ is a constant relating to the exposure conditions, is in the range of about 0.17 rad<θ< about 1.40 rad.

2. The method for manufacturing a circuit board according to claim 1, wherein each of the upper conductor connection and the lower conductor connection includes at least one material selected from the group consisting of Cu, Au, Ag, Al, Ni, Ti, Cr, NiCr, Nb, V, Ta, W, Pt, and Mo.

3. The method for manufacturing a circuit board according to claim 1, wherein the insulating resin film comprises at least one resin selected from polyimides, epoxies, benzocyclobutene, bismaleimide triazines, acrylics, and cyclic olefins.

4. The method for manufacturing a circuit board according to claim 1, wherein, in the step of forming an upper conductor connection on the insulating resin film, the upper conductor connection is formed on the insulating resin film by one of vapor deposition, sputtering, and plating.

5. The method for manufacturing a circuit board according to claim 1, wherein, in the photomask, the translucent strips are aligned substantially parallel to the top edge of the sloped inner wall, and the widths of the translucent strips are gradually increased from that of the strip corresponding to the bottom of the sloped inner wall to that of the strip corresponding to the top of the sloped inner wall so that the exposure level of the sloped inner wall is gradually increased from the bottom to the top of the sloped inner wall.

6. The method for manufacturing a circuit board according to claim 1, wherein the width of each of the translucent strips is in the range of about ¼ to about 1/20 of the thickness of the insulating resin layer and the interval between the translucent strips is in the range of about ¼ to about 1/20 of the thickness of the insulating resin layer.

7. The method for manufacturing a circuit board according to claim 1, wherein the number of translucent strips is 2 to 10.

8. The method for manufacturing a circuit board according to claim 1, wherein the substrate is made of a ceramic material.

9. The method for manufacturing a circuit board according to claim 1, wherein the substrate is made of one of alumina and a semiconductor.

10. The method for manufacturing a circuit board according to claim 1, wherein the lower conductor connection is coated with an adhesion promoter.

11. The method for manufacturing a circuit board according to claim 10, wherein a varnish-type cyclic olefin resin is applied onto the coated lower conductor connection by means of spin coating at about 1,000 rpm for approximately 30 seconds, and is then baked at about 95° C. for about 120 seconds using a hotplate so as to prepare the photosensitive resin film.

12. The method of manufacturing a circuit board according to claim 1, wherein in the step of exposing the photosensitive resin firm includes subjecting the photosensitive resin film to contact irradiation using ultraviolet light having a wavelength of about 365 nm at an exposure level of about 840 mJ/cm².

13. The method of manufacturing a circuit board according to claim 1, wherein the photomask is made of glass and has a substantially square light-shielding pattern at the center in the longitudinal direction.

14. The method of manufacturing a circuit board according to claim 1, wherein at each side of the light-shielding pattern, a pattern including a plurality translucent strips aligned alternately with light-shielding strips in a substantially parallel manner is provided.

15. The method of manufacturing a circuit board according to claim 14, wherein the widths of plurality of the translucent strips are approximately 1 μm to approximately 5 μm.

16. The method of manufacturing a circuit board according to claim 14, wherein the width of each of the light-shielding strips is about 1 μm.

17. The method of manufacturing a circuit board according to claim 1, wherein the photosensitive resin film is developed in 1,3,5-triisopropylbenzene at a constant temperature of about 32° C.

* * * * *